United States Patent
Sung et al.

(10) Patent No.: US 9,612,291 B2
(45) Date of Patent: Apr. 4, 2017

(54) SYSTEM AND METHOD FOR MEASURING INTERNAL RESISTANCE OF BATTERY

(71) Applicant: Hyundai Motor Company, Seoul (KR)

(72) Inventors: Woo Suk Sung, Gyeonggi-do (KR); Do Sung Hwang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 153 days.

(21) Appl. No.: 14/641,327

(22) Filed: Mar. 7, 2015

(65) Prior Publication Data

US 2016/0116546 A1 Apr. 28, 2016

(30) Foreign Application Priority Data

Oct. 24, 2014 (KR) ........................ 10-2014-0145290

(51) Int. Cl.
*G01N 27/416* (2006.01)
*G01R 31/36* (2006.01)

(52) U.S. Cl.
CPC ..... *G01R 31/3662* (2013.01); *G01R 31/3655* (2013.01); *G01R 31/3675* (2013.01)

(58) Field of Classification Search
CPC .................................................. G01R 31/3658
USPC ........................................................ 324/430
See application file for complete search history.

(56) References Cited

U.S. PATENT DOCUMENTS

| 4,052,717 A | * | 10/1977 | Arnold | G01R 19/16542 |
| | | | | 320/161 |
| 5,635,842 A | * | 6/1997 | Yokoo | G01R 31/3624 |
| | | | | 320/DIG. 21 |
| 2003/0210056 A1 | * | 11/2003 | Arai | G01R 31/3648 |
| | | | | 324/430 |
| 2013/0030736 A1 | | 1/2013 | Tanaka | |

FOREIGN PATENT DOCUMENTS

| JP | 2002-221559 A | 8/2002 |
| JP | 2002-252901 A | 9/2002 |
| JP | 3642092 B2 | 4/2005 |
| JP | 2008-128802 A | 6/2008 |
| JP | 2009-103471 A | 5/2009 |
| KR | 10-0460876 B1 | 12/2004 |
| KR | 10-2007-0020322 A | 2/2007 |
| KR | 2011-0006266 A | 1/2011 |
| KR | 10-1363195 B1 | 2/2014 |

* cited by examiner

*Primary Examiner* — Arun Williams
(74) *Attorney, Agent, or Firm* — Mintz Levin Cohn Ferris Glovsky and Popeo, P.C.; Peter F. Corless

(57) ABSTRACT

A system and method for more accurately measuring an internal resistance of a battery for a vehicle are provided. The method includes measuring, by a controller, current-voltage pairs for the battery and calculating a correlation between current and voltage in the measured current-voltage pairs. In addition, the internal resistance of the battery is measured using the current-voltage pairs having the correlation equal to or greater than a preset threshold.

12 Claims, 5 Drawing Sheets

SYSTEM AND METHOD FOR MEASURING INTERNAL RESISTANCE OF BATTERY

CROSS-REFERENCE TO RELATED APPLICATION

This application is based on and claims the benefit of priority to Korean Patent Application No. 10-2014-0145290, filed on Oct. 24, 2014 in the Korean Intellectual Property Office, the disclosure of which is incorporated herein in its entirety by reference.

TECHNICAL FIELD

The present disclosure relates to a system and method for measuring an internal resistance of a battery of a battery management system for a vehicle, and more particularly, to a system and method for measuring an internal resistance of a battery by reflecting a correlation between voltage and current of a high voltage lithium battery for a vehicle.

BACKGROUND

Generally, a vehicle using an internal combustion engine using gasoline or heavy oil as main fuel has a substantial effect on production of pollutants such as air pollution. Therefore, to reduce the production of pollutants, automobile industries are developing an electric vehicle or a hybrid electric vehicle.

The electric vehicle is a vehicle which uses a battery engine operated by electric energy output from a battery. Since the electric vehicle uses a battery, in which a plurality of secondary batteries that may be charged and discharged are formed as a single pack, as a main power source, the electric vehicle produces no exhaust gas and produces minimal noise. Meanwhile, the hybrid electric vehicle, which is an intermediate stage vehicle between a vehicle using an internal combustion engine and an electric vehicle, is a vehicle that uses two or more power sources, for example, an internal combustion engine and a battery engine. Today, a hybrid electric vehicle of a mixed type using an internal combustion engine and a fuel cell directly obtaining electric energy by a chemical reaction of hydrogen and oxygen that is supplied continuously, using a battery and a fuel cell, or the like has been developed.

Meanwhile, since a vehicle that uses electric energy directly depends on performance of a battery, a state of the battery may be diagnosed by measuring a voltage, a current, a resistance, and the like of each battery cell. As a use time of the battery is increased, characteristics of the battery in which an electrochemical reaction is caused are changed by an irreversible reaction within the battery. As a representative change in characteristics, an internal resistance of the battery is increased due to a change in characteristics of the battery, and thus the reduction in voltage characteristic, temperature characteristic, capacity of the battery, and the like occurs. In other words, when the internal resistance is accurately measured, the battery state regarding the reduction of the battery characteristics may be diagnosed.

As the typical method for measuring an internal resistance of a battery, a method has been developed for connecting a separate apparatus to measure an internal resistance to a battery or a method for estimating an internal resistance by performing a modeling analysis on a voltage output with respect to an input current of a battery.

However, when the battery is mounted within a vehicle it may be difficult to separate the battery to measure an internal resistance of the battery and time, cost, and the like may be increased. Further, when a separate apparatus for measuring an internal resistance of the battery is mounted within the vehicle, part costs may increase. Further, the method for analyzing an output value with respect to an input using a modeling method may be difficult to apply to an embedded environment. Further, as a statistical method, a method has been developed for obtaining a resistance using a voltage-current distribution in which a current dispersion is equal to or greater than a constant value. Additionally, it may be difficult to define selection criteria for a threshold based on the current dispersion (e.g., standard deviation) and the current distribution.

SUMMARY

The present disclosure provides a system and method for more accurately measuring an internal resistance of a battery by estimating the internal resistance using a voltage value and a current value having strong correlation by analyzing a correlation between voltage and current.

According to an exemplary embodiment of the present disclosure, a method for measuring an internal resistance of a battery of a battery management system may include measuring current-voltage pairs for the battery; calculating a correlation between current and voltage in the measured current-voltage pairs; and measuring the internal resistance of the battery using the current-voltage pairs having the correlation equal to or greater than a preset threshold.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
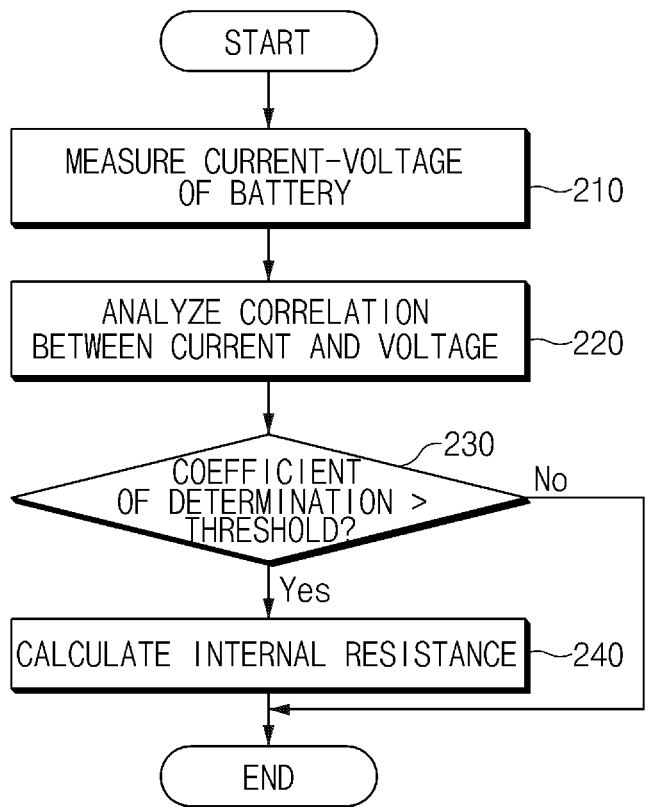
FIG. 1 is an exemplary flow chart illustrating a process of measuring an internal resistance of a battery according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power Although exemplary embodiments are described as using a plurality of units to perform the exemplary process, it is understood that the exemplary processes may also be performed by one or a plurality of modules. Additionally, it is understood that the term controller refers to a hardware device that includes a memory and a processor. The memory is configured to store the modules and the process is specifically configured to execute said modules to perform one or more processes which are described further below.

Furthermore, control logic of the present invention may be embodied as non-transitory computer readable media on a computer readable medium containing executable program instructions executed by a process, controller, or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present disclosure will be described in detail with reference to the accompanying drawings. Terms and words used in the present specification and claims are not to be construed as a general or dictionary meaning, but are to be construed as meaning and concepts meeting the technical ideas of the present disclosure based on a principle that the present inventors may appropriately define the concepts of terms in order to describe their disclosures in best mode. Therefore, configurations described in exemplary embodiments and the accompanying drawings of the present specification do not represent all of the technical spirits of the present disclosure, but are merely exemplary embodiments. Therefore, the present disclosure should be construed as including all the changes, equivalents, and substitutions included in the spirit and scope of the present disclosure at the time of filing this application.

FIG. 1 is an exemplary flow chart illustrating a process of measuring an internal resistance of a battery according to an exemplary embodiment of the present disclosure. First, a battery management system of a vehicle may be executed by a controller to measure a current value and a voltage value of a battery mounted within the vehicle for a predetermined time (S210). In particular, the current value and the voltage value may be measured by a current sensor and a voltage sensor connected to the battery while a vehicle is driven and may be measured for a predetermined period of time (e.g., a measured time), e.g., about 60 seconds at a preset constant measured period (e.g., 1 second). The measured period and the measured time may be controlled differently based on a selection of an operator.

Further, the battery management system may be configured to analyze a correlation between current and voltage using current-voltage pairs measured in S210 (S220). For example, the battery management system may be configured to analyze the correlation between current and voltage using a regression analysis and a correlation analysis. When a relationship between a dependent variable Y and an independent variable X is represented by a simple regression line (e.g., a regression equation) using a simple linear regression analysis, the relationship may be represented by the following Equation 1). When the simple regression equation is applied to the battery, the battery may have an output voltage that changes in proportion to a current, and therefore, the dependent variable Y may correspond to a voltage V and the independent variable X may correspond to a current I.

$$Y_i = a + bX_i + e_i \quad 1)$$

In the above equation, $Y_i$ represents an actually observed value for case i, a represents a regression constant of $Y_i$, and b represents a regression coefficient as a slope of the regression equation. Further, $e_i$ which is an error, a residual, or an error in estimation of the case i may be defined as a Y value of the case i which is not described as a model between the variables X and Y.

The simple regression analysis obtains a regression model minimizing variation of the residual under the relationship between the variables X and Y to derive the optimal linear regression line which may estimate the variable Y value most appropriate for data. Therefore, when the improved regression model is derived, the regression model equation may be represented by the following Equation 2), which is represented as a graph illustrated in FIG. 2.

$$\hat{Y}_i = a + bX_i \quad 2)$$

Figure 2:
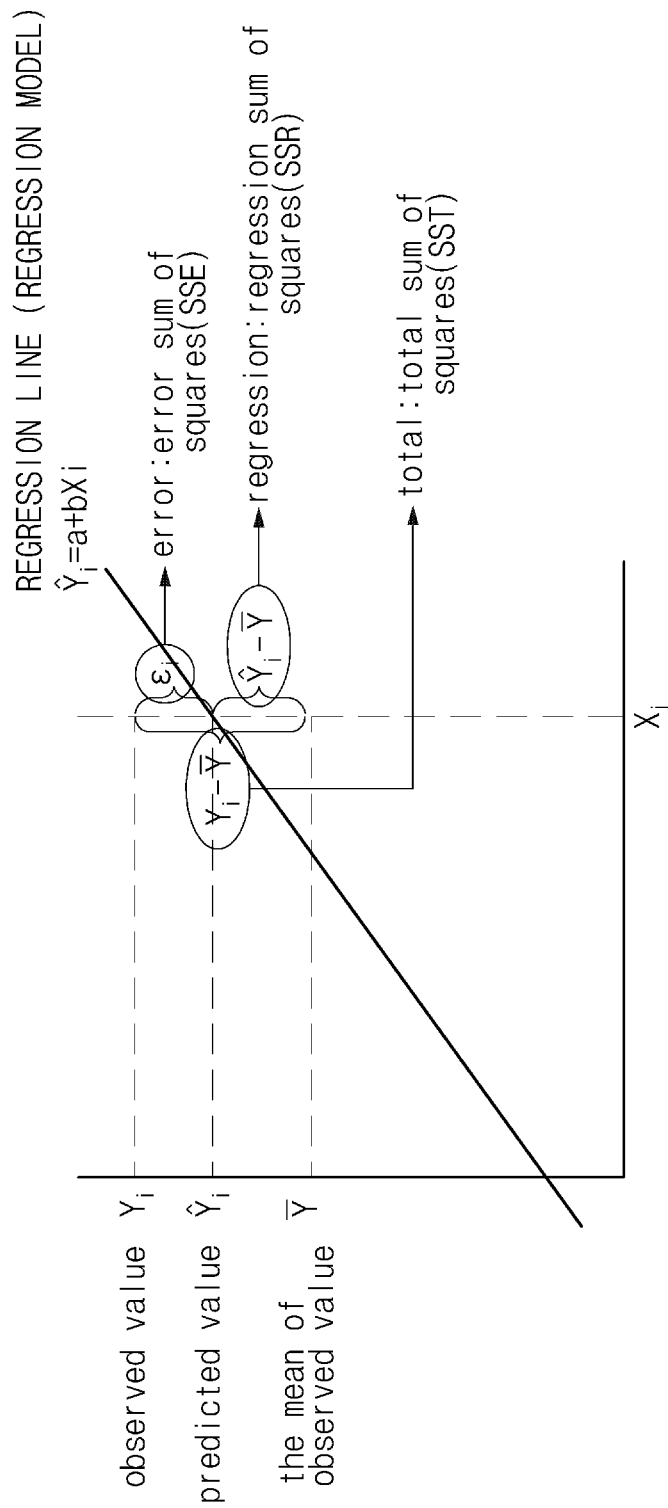
FIG. 2 is an exemplary diagram for describing a method for analyzing a correlation between current and voltage according to an exemplary embodiment of the present disclosure.

In FIG. 2, for a value $X_i$ of the variable X of the case i, a difference between an actually observed value $Y_i$ of the variable Y and a predicted value $\hat{Y}_i$ estimated by the regression line may become an error sum of squares (SSE), which may be represented by the following Equation 3).

$$SSE = \sum_{i=1}^{n} (y_i - \hat{y}_i)^2 \quad 3)$$

A difference between a predicted value $\hat{Y}_i$ for $X_i$ and the mean of observed value $\overline{Y}$ of the variable Y may become a regression sum of squares (SSR), which may be represented by the following Equation 4).

$$SSR = \sum_{i=1}^{n} (\hat{y}_i - \overline{y})^2 \quad 4)$$

Further, a sum of the error sum of squares (SSE) and the regression sum of squares (SSR) may become a total variation of the variable Y, that is, a total sum of squares (SST), which may be represented by the following Equation 5).

$$SST = \sum_{i=1}^{n}(y_i - \bar{y})^2 \qquad 5)$$

In particular, the SSR means a variation of the variable Y described by a variation of the variable X in a total variation of the variable Y and the SSE means the variation of the variable Y which is not described by the variation of the variable X in the total variation of the variable Y. Therefore, the battery management system may be configured to calculate a ratio $$\left(R^2 = \frac{SSR}{SST}\right)$$

of the regression sum of squares (SSR) to the total sum of squares (SST) and define the calculated value as a value that represents the correlation between current and voltage. According to the exemplary embodiment of the present disclosure, the value that represents the correlation between current and voltage is defined as a coefficient of determination for determining whether the battery management system begins the calculation of the internal resistance of the battery.

Furthermore, the battery management system may be configured to compare the coefficient of determination with a preset threshold (e.g., about 0.9) and in response to determining that a correlation coefficient is equal to or greater than the threshold (S230), the internal resistance value of the battery may be calculated based on a least mean square using the current-voltage data measured in S210 (S240). The temperature of the battery may also be considered during the calculation of the resistance value. For example, when the temperature of the battery ranges from about 20° C. to 30° C., normal characteristics appear, and therefore the battery management system may be configured to use a temperature sensor to measure the temperature of the battery and when a temperature T of the battery satisfies a condition of 25° C.<T<30° C., the controller of the battery management system may be configured to calculate the resistance value using the voltage-current data.

Figure 3:
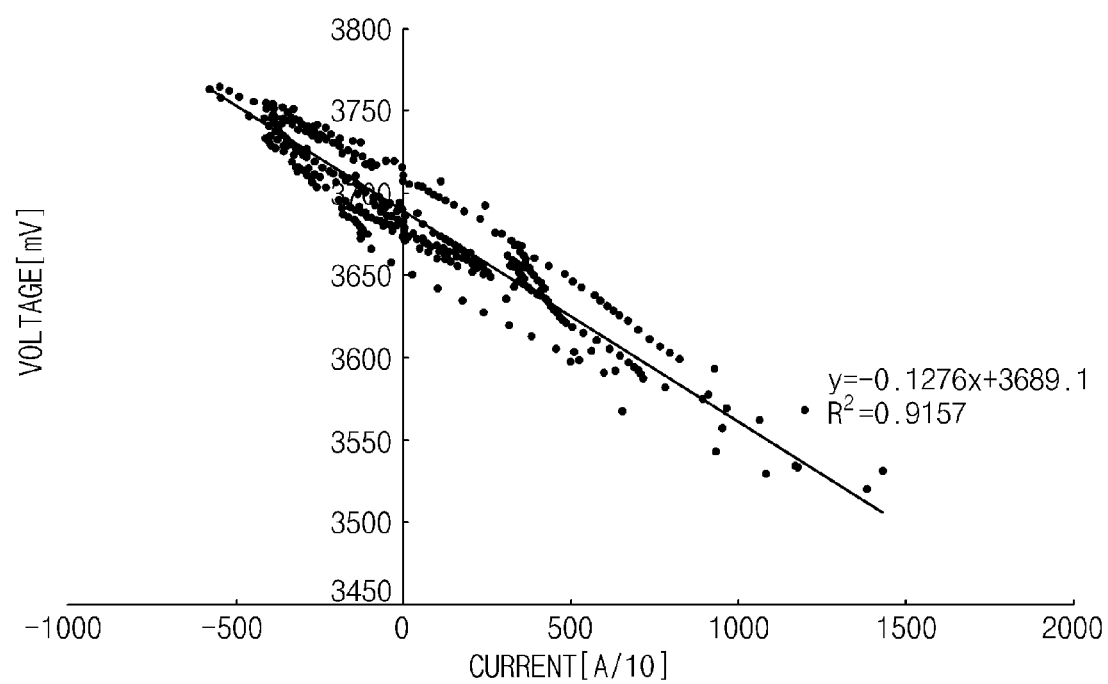
FIG. 3 is an exemplary diagram illustrating a current-voltage distribution when the correlation between current and voltage is 0.9157 ($R^2$=0.9157) and an estimated resistance value (linear slope) (1.276 mohm) at that time according to an exemplary embodiment of the present disclosure.
Figure 4:
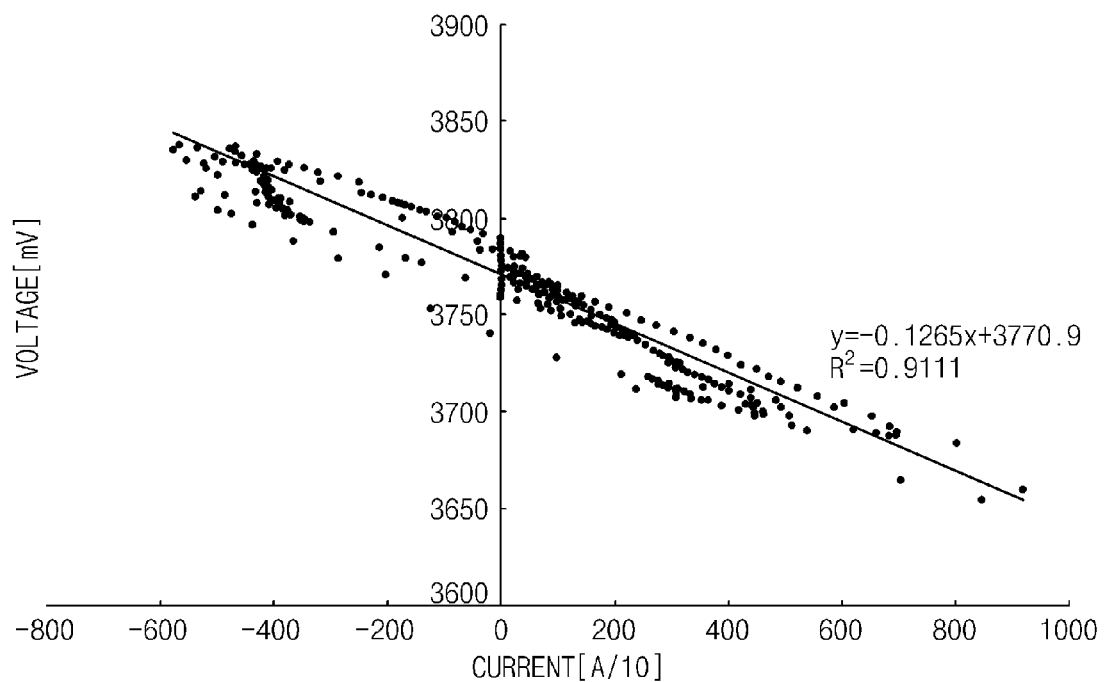
FIG. 4 is an exemplary diagram illustrating a current-voltage distribution when the correlation between current and voltage is 0.9111 ($R^2$=0.9111) and an estimated resistance value (linear slope) (1.265 mohm) at that time according to an exemplary embodiment of the present disclosure.

FIG. 3 is an exemplary diagram illustrating a current-voltage distribution when the correlation between current and voltage is 0.9157 ($R^2$=0.9157) and an estimated resistance value (e.g., linear slope) (about 1.276 mohm) at that time and FIG. 4 is an exemplary diagram illustrating a current-voltage distribution when the correlation between current and voltage is 0.9111 ($R^2$=0.9111) and an estimated resistance value (e.g., linear slope) (about 1.265 mohm) at that time. As illustrated in FIGS. 3 and 4, when the correlation between current and voltage is substantially high, it may be appreciated that the current-voltage pairs may be densely distributed.

Figure 5:
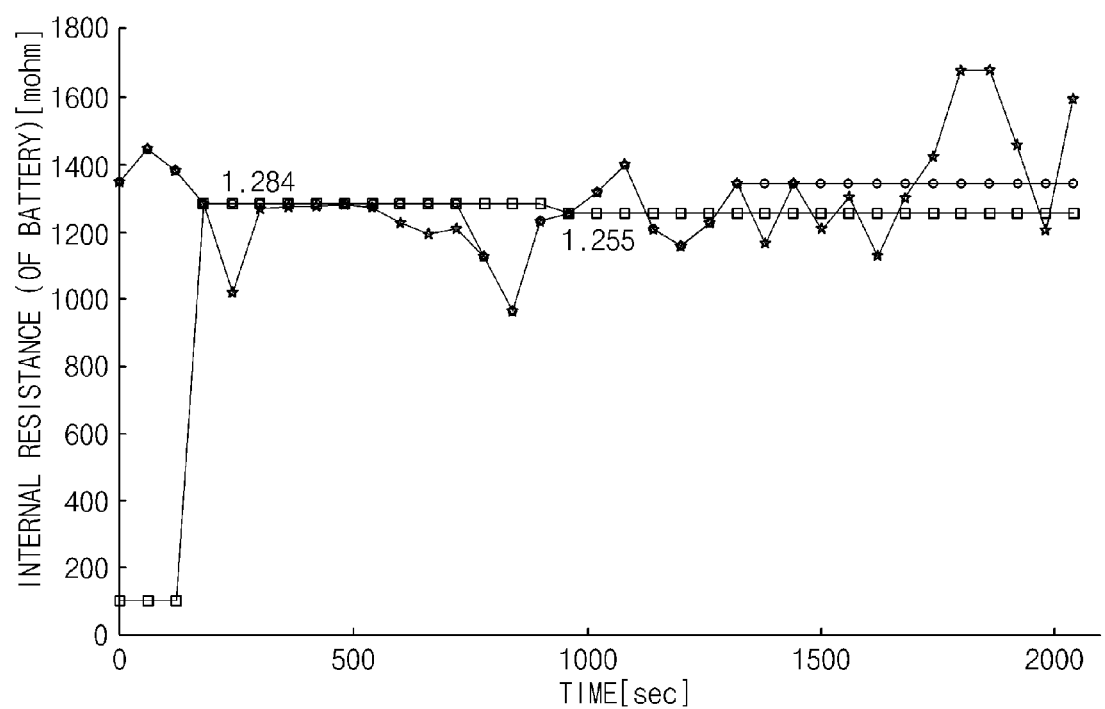
FIG. 5 is an exemplary diagram illustrating a result of estimating the internal resistance of the battery according to the related art, in consideration of a temperature, a standard deviation of current, and a current distribution.

Further, FIG. 5 is an exemplary diagram illustrating a result of estimating the internal resistance of the battery according to the related art, in consideration of a temperature, a standard deviation of current, and a current distribution. It may be appreciated that there is minima difference between resistance value (e.g., about 1.284 mohm, 1.255 mohm) estimated by a complex process in consideration of various temperatures, the standard deviation of current, and the current distribution as in the related art and the estimated resistance values (e.g., about 1.276 mohm, 1.265 mohm) using the correlation according to the present disclosure.

As described above, according to the exemplary embodiments of the present disclosure, it may be possible to more accurately measure the internal resistance of the battery by reflecting the correlation between voltage and current, in estimating the internal resistance of the battery. The exemplary embodiments of the present disclosure described above have been provided for illustrative purposes. Therefore, those skilled in the art will appreciate that various modifications, alterations, substitutions, and additions are possible without departing from the scope and spirit of the present disclosure as disclosed in the accompanying claims and such modifications, alterations, substitutions, and additions fall within the scope of the present disclosure.

What is claimed is:

1. A method for measuring an internal resistance of a battery of a battery management system, comprising:
    measuring, by a controller, current-voltage pairs for the battery;
    calculating, by the controller, a correlation between current and voltage in the measured current-voltage pairs, wherein in the calculation of the correlation, a ratio of a regression sum of squares (SSR) to a total sum of squares (SST) is calculated, where the total sum of squares (SST) represents a total variation of a dependent variable Y in a regression equation and the regression sum of squares (SSR) represents a difference between a predicted value for a value $X_i$ of an independent variable X of a case i and the mean of observed value of a dependent variable Y in the regression equation; and
    measuring, by the controller, the internal resistance of the battery using the current-voltage pairs having the correlation equal to or greater than a preset threshold.

2. The method according to claim 1, wherein the threshold is about 0.9.

3. The method according to claim 1, wherein in the measuring of the internal resistance, a resistance value is calculated based on a least mean square using data of the current-voltage pairs.

4. The method according to claim 1, wherein in the measuring of the internal resistance, when a temperature T of the battery satisfies a condition of 25° C.<T<30° C., a resistance value is calculated.

5. A system for measuring an internal resistance of a battery of a battery management system, comprising:
    a memory configured to store a plurality of program instructions
    a process configured to execute the program instructions, the program instructions when executed configured to:
    measure current-voltage pairs for the battery using a sensor;
    calculate a correlation between current and voltage in the measured current-voltage pairs, wherein in the calculation of the correlation, a ratio of a regression sum of squares (SSR) to a total sum of squares (SST) is calculated, where the total sum of squares (SST) represents a total variation of a dependent variable Y in a regression equation and the regression sum of squares (SSR) represents a difference between a predicted value for a value $X_i$ of an independent variable X of a case i and the mean of observed value of a dependent variable Y in the regression equation; and measure the internal resistance of the battery using the current-voltage pairs having the correlation equal to or greater than a preset threshold.

6. The system according to claim 5, wherein the threshold is about 0.9.

7. The system according to claim 5, wherein in the measuring of the internal resistance, a resistance value is calculated based on a least mean square using data of the current-voltage pairs.

8. The system according to claim 5, wherein in the measuring of the internal resistance, when a temperature T of the battery satisfies a condition of 25° C.<T<30° C., a resistance value is calculated.

9. A non-transitory computer readable medium containing program instructions executed by a controller, the computer readable medium comprising:
   program instructions that control a sensor to measure current-voltage pairs for the battery;
   program instructions that calculate a correlation between current and voltage in the measured current-voltage pairs, wherein in the calculation of the correlation, a ratio of a regression sum of squares (SSR) to a total sum of squares (SST) is calculated, where the total sum of squares (SST) represents a total variation of a dependent variable Y in a regression equation and the regression sum of squares (SSR) represents a difference between a predicted value for a value $X_i$ of an independent variable X of a case i and the mean of observed value of a dependent variable Y in the regression equation; and
   program instructions that measure the internal resistance of the battery using the current-voltage pairs having the correlation equal to or greater than a preset threshold.

10. The non-transitory computer readable medium of claim 9, wherein the threshold is about 0.9.

11. The non-transitory computer readable medium of claim 9, wherein in the measuring of the internal resistance, a resistance value is calculated based on a least mean square using data of the current-voltage pairs.

12. The non-transitory computer readable medium of claim 9, wherein in the measuring of the internal resistance, when a temperature T of the battery satisfies a condition of 25° C.<T<30° C., a resistance value is calculated.

* * * * *